United States Patent [19]
Chandrasekhar et al.

[11] Patent Number: 5,578,284
[45] Date of Patent: Nov. 26, 1996

[54] SILICON SINGLE CRYSTAL HAVING ELIMINATED DISLOCATION IN ITS NECK

[75] Inventors: Sadasivam Chandrasekhar, Chesterfield; Kyong-Min Kim, St. Charles, both of Mo.

[73] Assignee: MEMC Electronic Materials, Inc., St. Peters, Mo.

[21] Appl. No.: 483,304

[22] Filed: Jun. 7, 1995

[51] Int. Cl.$^6$ .................................................. C01B 33/02
[52] U.S. Cl. ........................... 423/348; 117/14; 117/201; 117/202; 117/932; 252/62.3 BT; 423/349
[58] Field of Search ................................. 23/301; 117/13, 117/14, 15, 200, 201, 202, 208, 911, 932; 252/62.3 BT; 423/348, 349

[56] References Cited

U.S. PATENT DOCUMENTS

| | | | |
|---|---|---|---|
| 3,819,421 | 6/1974 | Merkel et al. | 117/30 |
| 3,939,035 | 2/1976 | Keller | 437/82 |
| 5,126,113 | 6/1992 | Yamagishi et al. | 422/249 |
| 5,170,061 | 12/1992 | Baba | 117/201 |
| 5,183,528 | 2/1993 | Baba et al. | 117/15 |
| 5,240,684 | 8/1993 | Baba et al. | 117/14 |
| 5,288,363 | 2/1994 | Araki | 117/15 |

FOREIGN PATENT DOCUMENTS 05043379  8/1991  Japan.

OTHER PUBLICATIONS

"Silicon Crystals Almost Free of Dislocations"; Borle, et al; J. of Cryst. Growths (1971) pp. 223–225.

W. Dash "Growth of Silicon Crystals Free From Dislocations" Journal of Applied Physics, vol. 30, No. 4 (1959) pp. 459–474.

K. Kim et al. "Maximum Length of Large Diameter Czochralski Silicon Single Crystals At Fracture Stress Limit of Seed" Journal of Crystal Growth 100 (1990) pp. 527–528.

Primary Examiner—Felisa C. Garrett
Attorney, Agent, or Firm—Senniger, Powers, Leavitt & Roedel

[57] ABSTRACT

A silicon single crystal prepared by the Czochralski method including a neck having an upper portion, an intermediate portion, and a lower portion. The upper portion contains dislocations. The intermediate portion is between the upper and lower portions. A majority of the intermediate and lower portions has a diameter greater than 10 millimeters, and the lower portion is free of dislocations. The crystal also includes an outwardly flaring segment adjacent the lower portion of the neck, and a body adjacent the outwardly flaring segment.

17 Claims, 2 Drawing Sheets

SILICON SINGLE CRYSTAL HAVING ELIMINATED DISLOCATION IN ITS NECK

BACKGROUND OF THE INVENTION

The present invention relates generally to the preparation of silicon single crystals grown by the Czochralski process. The invention particularly relates to eliminating dislocations within the neck before the body of the silicon single crystal is grown.

Single crystal silicon which is the starting material for most processes for the fabrication of semiconductor electronic components is commonly prepared with the so-called Czochralski process. In this process, polycrystalline silicon ("polysilicon") is charged to a crucible and melted, a seed crystal is brought into contact with molten silicon and a single crystal is grown by slow extraction. As crystal growth is initiated, dislocations are generated in the crystal from the thermal shock of contacting the seed with the melt. The dislocations are propagated throughout the growing crystal and multiplied unless they are eliminated in the neck region between the seed crystal and the main body of the crystal.

The conventional Dash method of eliminating dislocations within silicon single crystals involves growing a neck having a small diameter (2 to 4 mm) at a high crystal pull rate (as high as 6 mm/min) to completely eliminate dislocations before growth of the body of the crystal. The dislocations are eliminated when the neck (known as a Dash neck) is grown to a length of up to 100 mm.

After dislocations are eliminated in the neck, its diameter is enlarged until the desired diameter of the main crystal body is reached. The body of the crystal is pulled from the melt until most of the melt is depleted, the tapered tail end of the crystal is formed, and the crystal is removed from the crystal pulling apparatus.

The neck, which is the weakest point of the crystal, can fracture during crystal growth, causing the body of the crystal to drop into the crucible. The impact of the crystal ingot and splashing molten polysilicon can destroy the crucible, susceptor, and heater, render the polysilicon melt unsalvageable, and present a serious safety hazard. Conventional 200 mm diameter crystals having a Dash neck are typically grown to a weight of 100 kg or less to minimize stress fracture of the neck.

Attempts have been made to minimize equipment and raw material losses and safety hazards from neck fractures by increasing the diameter of the neck. Japanese Kokai No. 05-43379 describes a method of eliminating dislocations while forming a neck having a diameter greater than that of a Dash neck. Dislocations are removed when the neck is pulled at a rate ranging from 4 mm/min to 6 mm/min and maintained at a constant diameter ranging from 4.5 mm to 10 mm. When the neck diameter exceeds 10 mm, dislocations are said to be difficult to eliminate.

It is generally accepted within the industry that dislocations cannot be consistently removed from necks having diameters exceeding 10 mm. The necks of most silicon single crystals continue to be grown according to the Dash technique even though the weight of a crystal body that can be supported by the Dash neck is limited.

Others have attempted to reduce neck fractures by providing additional support for the crystal body. U.S. Pat. No. 5,126,113 describes an apparatus for supporting a single crystal ingot as it is grown. Dislocations in the crystal are eliminated by growing a small diameter neck by the Dash method. A large diameter bulge is then grown beneath the Dash neck before the start of the conical section of the crystal body. Mechanical grips engage the recess beneath the bulge to support the body as it is grown. When the grips hold the crystal, they may disturb the steady crystal growth operating conditions and may also break the Dash neck.

There is a need for an improved process for eliminating dislocations within the neck of a single crystal such that larger diameter, zero dislocation (i.e., dislocation-free) single crystals can be produced without substantial equipment damage, loss of raw materials, safety hazards and reduced throughput and yield.

SUMMARY OF THE INVENTION

Among the objects of the invention, therefore, may be noted the provision of a single crystal having a large diameter neck that is dislocation-free, the provision of a single crystal having a neck that is capable of supporting a heavy crystal body without breaking during crystal growth or handling, the provision of a single crystal having a neck that is capable of supporting a large diameter crystal body that could not be supported by a conventional neck, and the provision of improved yield and throughput of zero dislocation single crystals grown by the Czochralski process.

Other objects and advantages of the invention will be apparent from the following detailed description.

The present invention is directed to a silicon single crystal prepared by the Czochralski method including a neck having an upper portion, an intermediate portion, and a lower portion. The upper portion contains dislocations. The intermediate portion is between the upper and lower portions. A majority of the intermediate and lower portions has a diameter greater than 10 millimeters, and the lower portion is free of dislocations. The crystal also includes an outwardly flaring segment adjacent the lower portion of the neck, and a body adjacent the outwardly flaring segment.

The present invention is also directed to a silicon single crystal prepared by the Czochralski method which includes a neck having an upper portion, an intermediate portion, and a lower portion. The upper portion contains dislocations. The intermediate portion is between the upper and lower portions. No portion of the intermediate and lower portions has a diameter less than about 10 millimeters. The lower portion is free of dislocations. The crystal also includes an outwardly flaring segment adjacent the lower portion of the neck, and a body adjacent the outwardly flaring segment. The body weighs at least 200 kilograms and is completely supported by the neck as the body is grown from molten silicon.

Another embodiment of the present invention is a silicon single crystal prepared from $p^+$-type silicon by the Czochralski method. The crystal includes a neck having an upper portion, an intermediate portion, and a lower portion. The upper portion contains dislocations. The intermediate portion is between the upper and lower portions. A majority of the intermediate and lower portions has a diameter greater than 10 millimeters, and no portion of the intermediate and lower portions has a diameter less than about 8.5 millimeters or greater than about 17 millimeters. The lower portion is free of dislocations. The crystal includes an outwardly flaring segment adjacent the lower portion of the neck, and a body adjacent the outwardly flaring segment.

Yet another embodiment of the invention is a process for eliminating dislocations in the neck of a silicon single crystal grown by the Czochralski method. Polycrystalline silicon is heated in a crucible to form a melt. A seed crystal is brought into contact with the melt until the seed crystal begins to melt, forming dislocations in the seed crystal. The seed crystal is then withdrawn from the melt to form a neck comprising an upper portion and an intermediate portion. The upper portion is between the seed crystal and the intermediate portion and contains dislocations. A majority of the intermediate portion has a diameter greater than 10 millimeters. The neck is grown at a rate less than about 4.0 mm/min until the dislocations within the intermediate portion are eliminated.

DETAILED DESCRIPTION OF THE PREFERRED EMBODIMENTS

In accordance with the present invention, it has been discovered that dislocations can be eliminated in a crystal neck having a diameter exceeding ten millimeters when the crystal is pulled at a rate less than about 4.0 mm/min. It has been found that dislocations are annihilated at a faster rate than they are generated when the neck is grown at slower pull rates, allowing complete elimination of dislocations in large diameter crystal necks. The process enables the growth of crystal ingots of more than 400 mm diameter weighing more than 200 kg.

Figure 1:
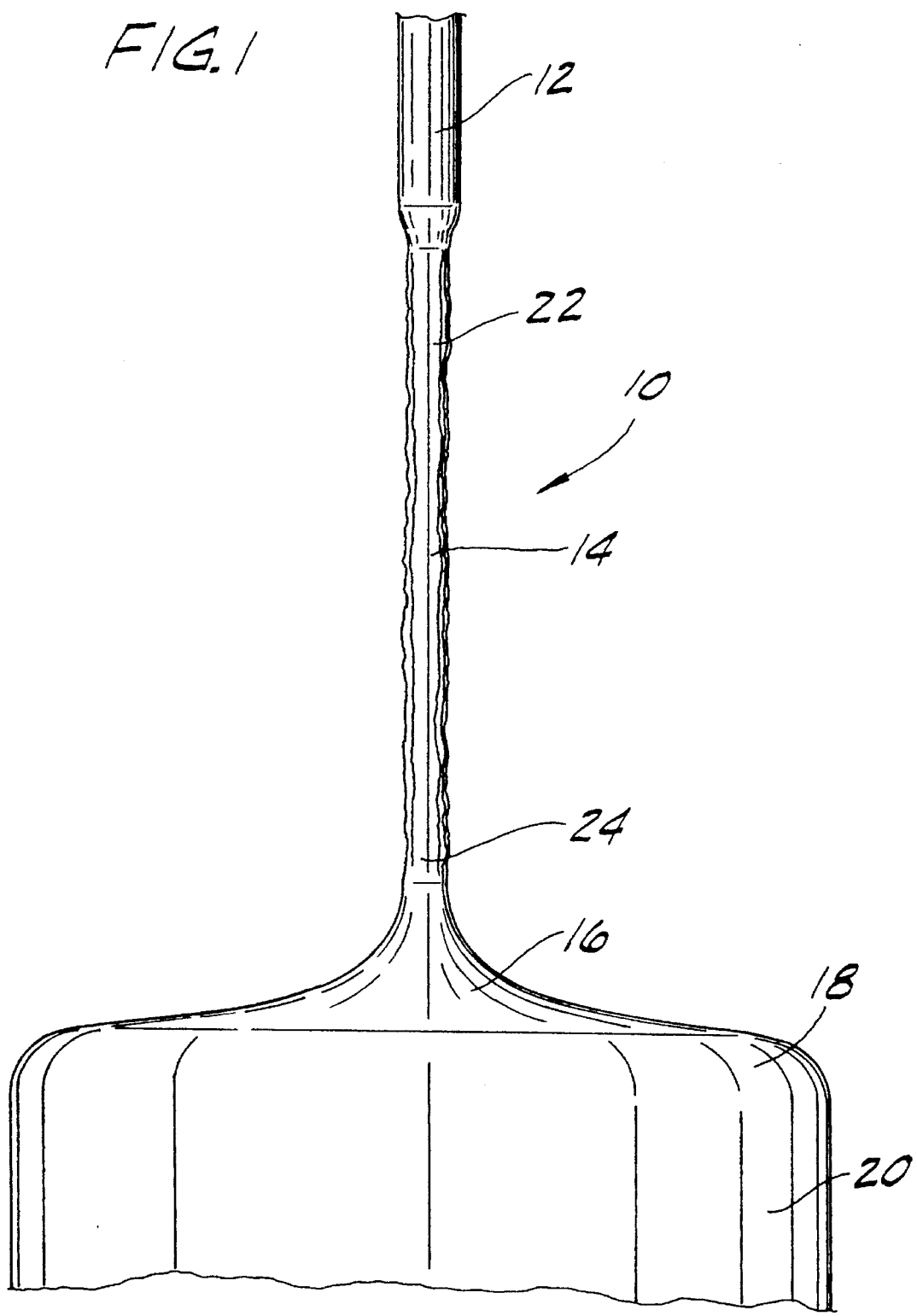
FIG. 1 is a vertical section illustrating the upper region of a single crystal embodying the present invention.

Turning now to FIG. 1, there is shown a single crystal 10 having a seed crystal 12, a neck 14, a cone 16, a shoulder 18 and a body 20. The crystal 10 is grown starting with the dislocation-free seed crystal 12 and molten semiconductor material such as silicon by the Czochralski method. The neck 14 includes an upper portion 22 grown as the seed crystal 12 is drawn from the silicon melt, an intermediate portion 24 grown beneath the upper portion, and a lower portion 26 grown beneath the intermediate portion.. The intermediate and lower portions 24, 26 are grown at a substantially constant diameter. For purposes of the present invention, a substantially constant diameter is maintained when the diameter of the intermediate and lower portions of the neck remains within fifteen percent of the desired diameter along the length of the intermediate and lower portions. The upper portion 22 is generally tapered from the diameter of the seed crystal 12 to the smaller, substantially constant diameter of the intermediate portion 24. However, the diameter of the seed crystal and the upper, intermediate and lower portions can be substantially the same such that the upper portion does not flare outwardly relative to the intermediate portion.

The segment of the upper portion 22 adjacent to the seed 12 contains dislocations (not shown) first introduced by thermal shock on bringing the dislocation free seed crystal into contact with the silicon melt. As the neck is grown at a pull rate less than about 4.0 mm/min, the dislocations are annihilated more quickly than they are formed. The density of dislocations decreases in the intermediate portion of the neck, and the dislocations are completely eliminated in the lower portion 26 of the neck.

Once the lower portion 26 of the neck is dislocation-free, the remainder of the Czochralski process proceeds in a conventional manner. An outwardly flaring segment 28 of the cone 16 is grown adjacent to the dislocation-free lower portion of the neck. The cone 16 is grown by continually increasing the diameter of the crystal. The shoulder 18 is formed when the desired diameter of the single crystal is reached. The pull rate is then maintained as the body 20 is grown at the same diameter as the shoulder 18. A tapered tail end (not shown) is formed when the melt is nearly depleted by increasing the pull rate and melt temperature. The single crystal can remain dislocation-free after neck growth. Generation of a new dislocation in silicon is exceedingly difficult under growth conditions prevailing in a conventional Czochralski puller.

The method of the present invention eliminates dislocations in the neck while maintaining a large diameter in the neck. The majority of the intermediate and lower portions of the neck is grown at a diameter greater than ten millimeters. Preferably, at least about 50%, 60% or 70% of the intermediate and lower portions has a diameter greater then ten millimeters, more preferably, at least about 80%, and even more preferably, at least about 90% or 100%. The neck must be such that dislocations within it will be eliminated before growth of the outwardly flaring segment of the cone is initiated. In a preferred embodiment of the invention, the dislocations are eliminated so long as no portion of the intermediate and lower portions has a diameter exceeding about 17 millimeters, and, most preferably, about 15 millimeters. Preferably, no portion of the intermediate and lower portions has a diameter less than about 8.5 mm or greater than about 17 mm, more preferably, less than about 10 mm or greater than about 15 mm, and, even more preferably, less than about 10 mm or greater than about 13 mm.

The diameter of the intermediate and lower portions of the neck is maintained while growing the neck at a pull rate less than 4.0 mm/min, and, preferably, less than 3.0 mm/min. Generally, the pull rate ranges from about 1.0 mm/min to about 3.0 mm/min, preferably, from about 1.8 mm/min to about 2.2 mm/min, and, more preferably, at about 2.0 mm/min. Although faster pull rates can be used, experience to date has shown that fluctuations in neck diameter may be difficult to control, and excessive fluctuations may cause dislocations to form. Experience with Dash neck growth has also shown that dislocations may be more difficult to remove at a pull rate below 1.0 mm/min.

The pull rate is adjusted in response to diameter fluctuations throughout the crystal growth process. Dislocations can be eliminated from the neck if the diameter of the intermediate and lower portions of the neck remains within fifteen percent of the desired diameter (i.e., substantially constant), or, preferably, within ten percent of the desired diameter. The pull rate and melt temperature are used to maintain the diameter within an acceptable range. The pull rate is decreased as the diameter becomes too narrow, or increased as the diameter becomes too wide.

The neck is grown to a length at which all dislocations have been eliminated. The appropriate length can be determined by growing a crystal neck at a desired diameter, pull rate and length, grinding the faces of an axial slice of the entire neck length, lapping and chemically etching the faces to reveal dislocations, and measuring the length at which the dislocations were eliminated. Subsequent crystals grown at the same diameter and pull rate can be grown to approximately the same length. For example, when the desired diameter is between 10 mm and about 13 mm, it is preferred to grow an intermediate and lower neck portion which ranges in length from about 120 mm to about 180 mm, and, more preferably, from about 150 mm to about 160 mm. Growth of a longer intermediate and lower portion than is necessary for elimination of dislocations increases the cost of the crystal pulling operation and reduces throughput.

The process of the present invention is particularly suitable for eliminating dislocations in the large diameter neck of a silicon single crystal. Preferably, the process is used to eliminate dislocations within a single crystal formed of $p^+$-type silicon, which is silicon doped with boron, having a resistivity not greater than 0.1 Ω-cm. Although the process may also be used to eliminate dislocations within a single crystal formed of other semiconductor materials or other types of silicon, experience has shown that dislocations are more readily eliminated from $p^+$-type silicon than from $n^+$-type or $p^-$-type silicon.

The process of the present invention can be automated when using a commercially available crystal pulling apparatus such as a Hamco Model 3000 CZ puller. The operator can select the desired diameter and length of the intermediate and lower neck portion, target pull rate, and the parameters for the remainder of the Czochralski pulling process. The crystal pulling apparatus will control the diameter, pull rate and heater power to maintain a substantially constant diameter for the intermediate and lower portion as described above. During crystal growth, the presence of facet lines on the crystal surface indicates the absence of dislocations in the crystal. After the crystal is pulled, the ingot can be sliced into wafers that can be analyzed for dislocations to determine whether a zero dislocation crystal was grown. If dislocations are apparent upon visual inspection of the wafers, dislocations may not have been removed in the crystal neck.

The following examples are presented to describe preferred embodiments and utilities of the present invention and are not meant to limit the present invention unless otherwise stated in the claims appended hereto.

EXAMPLE 1

A silicon single crystal was pulled in an automated Hamco Model 3000 Czochralski crystal puller containing a fused quartz crucible charged with 26 kg of chunk $p^+$-type polysilicon containing $1 \times 10^{19}$ atoms boron/cm$^3$ (0.009 Ω-cm target resistivity). A target pull rate of 2.4 mm/min, a neck diameter of 11 mm, and a neck length of 200 mm were selected. The neck was grown automatically as the crystal puller adjusted the heater power and pull rate to maintain the desired neck diameter.

Figure 2:
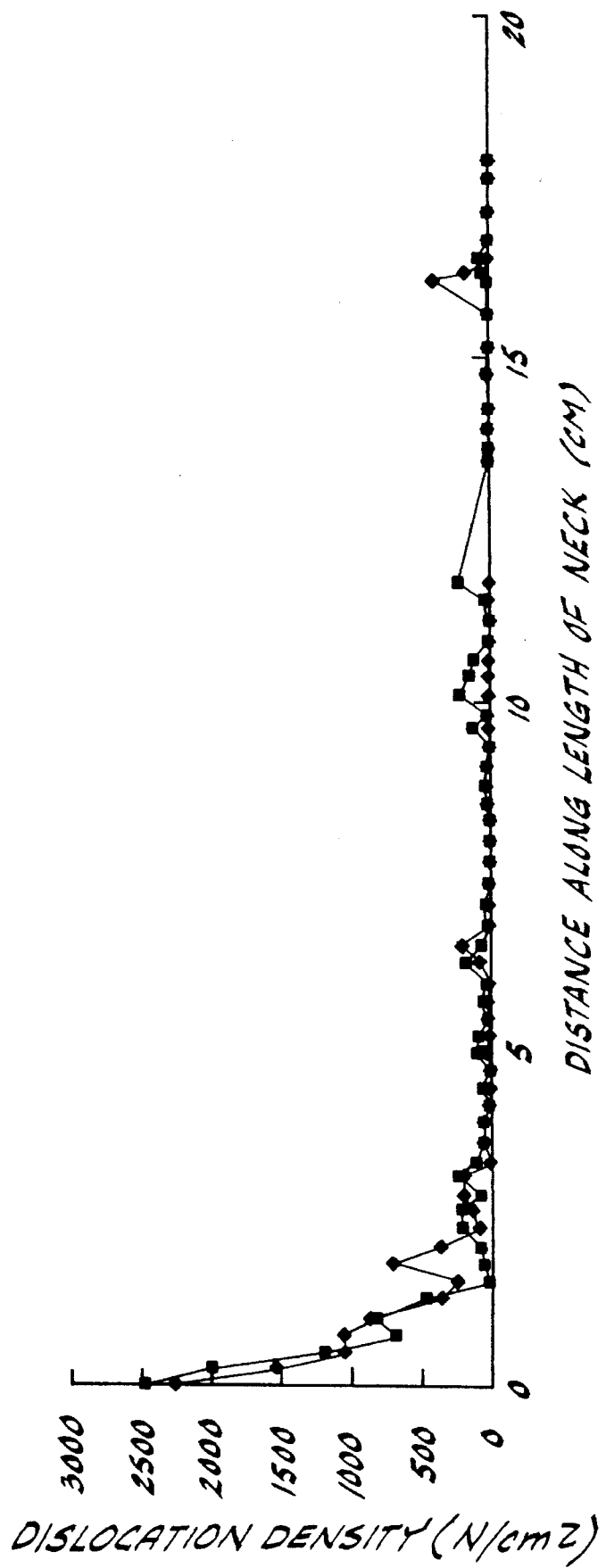
FIG. 2 illustrates the dislocation density along the length of the neck of a single crystal.

The neck of the single crystal was then chemically etched to reveal dislocations. The (110) faces of an axial section of the entire neck were ground, mechanically polished, and then chemically polished for ten minutes in 10:3:1 HAc:HNO$_3$:HF solution to remove any surface damage. The faces were then Wright etched for 20 minutes to reveal dislocation etch pits. The etch pits were observed under a Nikon Nomarski Interference Contrast microscope under 100X magnification. The density of dislocations along the length of the crystal, at the center (—♦—) and edge (—■—), is shown in FIG. 2. No dislocation etch pits were observed in the bottom portion of the neck which ranged from 180 mm to 200 mm, indicating complete elimination of dislocations within the neck of the crystal.

EXAMPLE 2

A silicon single crystal was pulled in a Leybold-2000 Czochralski crystal puller charged with 60 kg of chunk $p^+$-type polysilicon containing $1 \times 10^{19}$ atoms boron/cm$^3$ (0.009 Ω-cm target resistivity). A target pull rate of 2.0 mm/min, a neck diameter of 13 mm, and a neck length of 165 mm were selected. The neck was grown automatically as the crystal puller adjusted the heater power and pull rate to maintain the desired neck diameter. The neck diameter varied between 12 mm and 14 mm, and the actual pull rate varied between 1.0 mm/min and 3.0 mm/min during neck growth.

Facet lines were present throughout the crystal run, indicating the absence of dislocations. Additionally, no dislocation etch pits were visually observed in wafers cut from the single crystal, indicating complete elimination of dislocations within the neck of the crystal.

While the invention is susceptible to various modifications and alternative forms, specific embodiments thereof have been shown by way of example in the drawings and have been described herein in detail. It should be understood, however, that it is not intended to limit the invention to the particular form disclosed, but on the contrary, the intention is to cover all modifications, equivalents and alternatives falling within the spirit and scope of the invention as defined by the appended claims.

We claim:

1. A silicon single crystal prepared by the Czochralski method comprising:

a neck having an upper portion, an intermediate portion, and a lower portion, the upper portion containing dislocations, the intermediate portion being between the upper and lower portions, a majority of the intermediate and lower portions having a diameter greater than 10 millimeters, and the lower portion being free of dislocations;

an outwardly flaring segment adjacent the lower portion of the neck; and a body adjacent the outwardly flaring segment.

2. The crystal of claim 1 wherein no portion of the intermediate or lower portions has a diameter greater than about 17 millimeters.

3. The crystal of claim 1 wherein no portion of the intermediate or lower portions has a diameter less than about 8.5 millimeters or greater than about 15 millimeters.

4. The crystal of claim 1 wherein no portion of the intermediate or lower portions has a diameter less than about 10 millimeters.

5. The crystal of claim 1 wherein the body is free of dislocations and has a diameter of at least 200 mm.

6. The crystal of claim 1 wherein the silicon is $p^+$-type silicon.

7. The crystal of claim 1 wherein the upper portion is outwardly flaring relative to the intermediate portion.

8. A silicon single crystal prepared by the Czochralski method comprising:

a neck having an upper portion, an intermediate portion and a lower portion, the upper portion containing dislocations, the intermediate portion being between the upper and lower portions, no portion of the intermediate or lower portions having a diameter less than about 10 millimeters, and the lower portion being free of dislocations;

an outwardly flaring segment adjacent the lower portion of the neck; and a body adjacent the outwardly flaring segment, the body weighing at least 200 kilograms and being completely supported by the neck as the body is grown from molten silicon.

9. The crystal of claim 8 wherein the body is free of dislocations.

10. The crystal of claim 8 wherein the silicon is $p^+$-type silicon.

11. The crystal of claim 8 wherein the upper portion is outwardly flaring relative to the intermediate portion.

12. The crystal of claim 8 wherein no portion of the intermediate or lower portions has a diameter greater than about 17 millimeters.

13. The crystal of claim 8 wherein the body is free of dislocations and has a diameter of at least 200 mm.

14. A silicon single crystal prepared from $p^+$-type silicon by the Czochralski method, the crystal comprising:

a neck having an upper portion, an intermediate portion and a lower portion, the upper portion containing dislocations, the intermediate portion being between the upper and lower portions, a majority of the intermediate and lower portions having a diameter greater than 10 millimeters, the lower portion being free of dislocations, and no portion of the intermediate and lower portions having a diameter less than about 8.5 millimeters or greater than about 17 millimeters;

an outwardly flaring segment adjacent the lower portion of the neck; and a body adjacent the outwardly flaring segment.

15. The crystal of claim 14 wherein the body is free of dislocations and has a diameter of at least 200 mm.

16. The crystal of claim 14 wherein the upper portion is outwardly flaring relative to the intermediate portion.

17. The crystal of claim 14 wherein no portion of the intermediate or lower portions has a diameter greater than about 15 millimeters.

* * * * *

UNITED STATES PATENT AND TRADEMARK OFFICE
CERTIFICATE OF CORRECTION

PATENT NO. : 5,578,284
DATED : November 26, 1996
INVENTOR(S) : Sadasivam Chandrasekhar and Kyong-Min Kim It is certified that error appears in the above-identified patent and that said Letters Patent is hereby corrected as shown below:

In claim 3, column 6, line 36, "claim I" should read --claim 1--.

Signed and Sealed this

Seventeenth Day of June, 1997

*Attest:*

BRUCE LEHMAN

*Attesting Officer*  *Commissioner of Patents and Trademarks*